United States Patent
Okuno et al.

(10) Patent No.: US 6,398,561 B1
(45) Date of Patent: Jun. 4, 2002

(54) CONTACT STRUCTURE OF LEAD

(75) Inventors: Toshio Okuno; Etsuji Suzuki, both of Kanagawa-ken (JP)

(73) Assignees: Soshotech Co., Ltd., Kanagawa-Ken; Yamaichi Electronics Co., Ltd., Tokyo, both of (JP)

( * ) Notice: Subject to any disclaimer, the term of this patent is extended or adjusted under 35 U.S.C. 154(b) by 0 days.

(21) Appl. No.: 09/902,262

(22) Filed: Jul. 11, 2001

(30) Foreign Application Priority Data

Sep. 13, 2000 (JP) ........................................ 2000-278313

(51) Int. Cl.$^7$ .............................................. H01R 12/00
(52) U.S. Cl. ........................................... 439/83; 29/831
(58) Field of Search ........................ 439/67, 83; 29/831

(56) References Cited

U.S. PATENT DOCUMENTS

| | | | |
|---|---|---|---|
| 5,354,205 A | 10/1994 | Feigenbaum et al. | 439/67 |
| 5,575,662 A * | 11/1996 | Yamamoto et al. | 439/67 |
| 6,230,402 B1 * | 5/2001 | Sexton et al. | 29/846 |

FOREIGN PATENT DOCUMENTS

WO         90/10320         9/1990

* cited by examiner

Primary Examiner—Tho D. Ta
Assistant Examiner—Ann McCamey
(74) Attorney, Agent, or Firm—Wenderoth, Lind & Ponack, L.L.P.

(57) ABSTRACT

A contact structure of a lead in which a contact structure having a lead and a bump made of suitable metals, respectively, can be formed easily and the bump and the lead can be soundly connected together in terms of electricity and strength. The contact structure of the lead comprises a lead 12 formed by etching a conductive foil 11, and a bump 5 formed by electric casting by means of plating. The bump 5 and the lead 12 are formed of different metals, respectively, and the bump 5 is connected to a surface of the lead 12 through a conductive connecting material 10. The lead 12 is intimately contacted at a surface, on which the bump 5 is disposed, with a first main surface 15 of a holeless insulative sheet 8. A basal portion of the bump 5 is forcibly pierced into and extended all the way through the thickness of a material of the holeless insulative sheet 8 and a side surface of the basal portion of the bump 5 is fusion-adhered to an inner wall surface of the through-hole 17. A distal portion of the bump 5 is projected from a second main surface 16 of the insulative sheet 8.

4 Claims, 4 Drawing Sheets

CONTACT STRUCTURE OF LEAD

BACKGROUND OF THE INVENTION

This invention relates to a contact structure in which a bump is annexed to a lead extending on an insulative sheet.

U.S. Pat. No. 5,354,205 discloses a probe pad in which a lead and a bump are formed of a single metal by plating growth and the bump is press contacted with an electrode pad of a circuit element to be tested.

The metal of which the bump is formed is required to have durability sufficient to withstand repeated contact and hardness sufficient to break an oxide film on a surface of the electrode pad. As such metal, nickel or nickel alloy is normally used.

On the other hand, the metal of which the lead is formed is required to have excellent conductivity and be comparatively flexible. As such metal, copper or copper alloy is normally used.

In the above-mentioned U.S. Pat. No. 5,354,205, the bump and the lead are formed of the same metal. This involves the problem that if copper or copper alloy which is good for the lead is selected, it cannot satisfy the requirement for the bump and, on the contrary, if nickel or nickel alloy which is good for the bump is selected, cracking is liable to occur when the lead is bent.

SUMMARY OF THE INVENTION

It is, therefore, an object of the present invention to provide a contact structure of a lead which is capable of solving the above problem.

Another object of the present invention is to provide a contact structure of a lead in which a bump and a lead are soundly connected together in terms of electricity and strength.

A contact structure according to a first aspect of the present invention includes a lead formed by etching a conductive foil and a bump formed by electric casting by means of plating. The bump and the lead are formed of different metals, respectively.

The bump is connected to a surface of the lead through a conductive connecting material. The lead is intimately contacted at a surface, on which the bump is disposed, with a first main surface of a holeless insulative sheet.

A basal portion of the bump is forcibly pierced into and extended all the way through a material of the holeless insulative sheet and a side surface of the basal portion of the bump is fusion-adhered to an inner wall surface of the through-hole. A distal portion of the bump is projected from a second main surface of the insulative sheet so as to be subjected to press contact with an electrode pad of a given electric part.

A contact structure according to a second aspect of the present invention includes a lead formed by plating and a bump formed by electric casting by means of plating. The bump and the lead are formed of different metals, respectively.

The bump is connected, by plating, to a surface of the lead. The lead is intimately contacted at a surface, on which the bump is disposed, with a first main surface of a holeless insulative sheet.

A basal portion of the bump is forcibly pierced into and extended all the way through the thickness of a material of the holeless insulative sheet and a side surface of the basal portion of the bump is fusion-adhered to an inner wall surface of the through-hole. A distal portion of the bump is projected from a second main surface of the insulative sheet so as to be press contacted with an electrode pad of a given electric part.

A contact structure according to a third aspect of the present invention includes a lead formed by plating and a bump formed by electric casting by means of plating. The bump and the lead are formed of different metals, respectively.

The lead is intimately contacted with and extended on a surface of an insulative sheet, and the bump is connected, by plating, to a surface of the lead.

The bump has a recess formed in the plate-connecting surface and the lead has a protrusion portion connected, by plating, along an inner wall surface of the recess.

A part of the lead connected, by plating, to the bump is embedded in the insulative sheet.

DETAILED DESCRIPTION OF THE EMBODIMENTS

A first embodiment of the present invention will now be described with reference to FIGS. 1(A)–1(F) and 3. A contact structure according to the first embodiment is manufactured in the following manners.

Figure 1A:
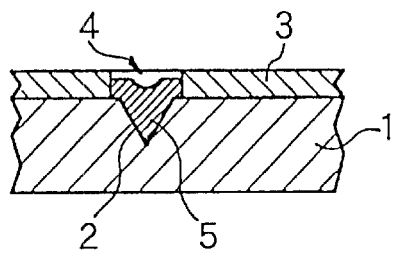
FIGS. 1(A) to 1(F) are sectional views showing the manufacturing processes of a contact structure according to a first embodiment of the present invention.

As shown in FIG. 1(A), a bump forming plate 1 formed of a stainless steel or the like has a plurality of bump forming recesses 2 which are open at a surface of the plate 1.

The overall area of the bump forming plate 1 only excluding the area where the bump forming recesses 2 are formed is covered with a resist layer 3. Bump forming holes 4 are formed in the resist layer 3 such that the holes 4 correspond to the recesses 2, individually.

Subsequently, plating growth is encouraged in each bump forming recess 2 and bump forming hole 4 so that the interior of each recess 2 and hole 4 is filled with a plating-grown metal as represented by a nickel or nickel alloy. That is to say, the bump 5 is formed in each recess 2 and hole 4 by electric casting.

Figure 3:
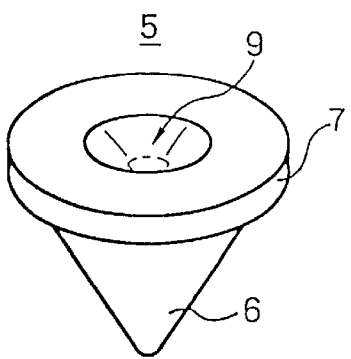
FIG. 3 is a perspective view of a bump obtained by the above various manufacturing processes and by the manufacturing processes to be described below.

As shown in FIG. 3, a conical or spherical press contact portion 6 is formed on a distal end portion of this bump 5 within the bump forming recess 2, and a flange 7 is formed on a basal portion of the bump 5 within the bump forming hole 4. The flange 7 is provided at a central area thereof, i.e., a central area of a bottom surface of the bump 5, with a dent 9.

Figure 1B:
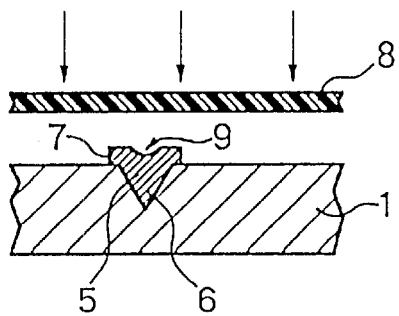

As shown in FIG. 1(B), after the resist layer 3 is removed, a holeless insulative sheet 8 is superimposed upon the surface of the bump forming plate 1 and flatly thermally pressed. As a preferred material of this insulative sheet 8, a liquid crystal polymer sheet is used.

Figure 1C:
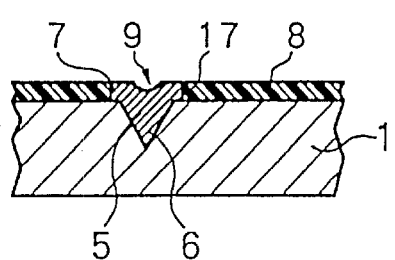

The insulative sheet 8 is plasticized by this thermal pressing. The basal end portion of the bump 5 is forcibly pierced into the plasticized insulative sheet 8 while pushing aside the material of the sheet 8 and extended all the way through the thickness of the sheet 8 so as to be exposed at the surface of the insulative sheet 8 opposite to the superimposing surface, as shown in FIG. 1(C).

The above liquid crystal polymer is small in expansion/contraction against heat and has a low viscosity at the time of thermal softening. Accordingly the polymer readily allows the piercing of the bump 5, and sound fusion adhesion can be achieved therebetween.

Figure 1D:
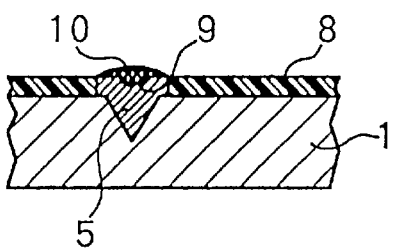

The bump 5 formed by the plating-growth has the dent 9 formed in its basal end face. As shown in FIG. 1(D), a conductive paste 10 is charged into this dent 9 such that the paste 10 is bulged from an open surface of the dent 9. The charging of the conductive paste 10 is performed by printing or through a nozzle.

Figure 1E:
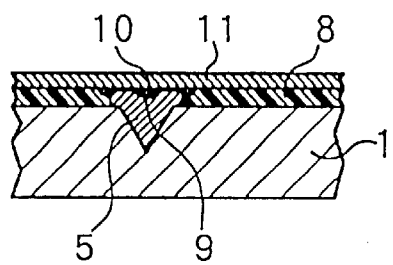

Then, as shown in FIG. 1(E), a conductive foil 11 preferably made of a copper or copper alloy is thermally press-adhered to the surface of the insulative sheet 8 in a laminated state, and the foil 11 and the bump 5 are adhered together through the conductive paste 10. The conductive foil 11 and the insulative sheet 8 are thermally press-adhered together by thermally melting the surface of the sheet 8.

Figure 1F:
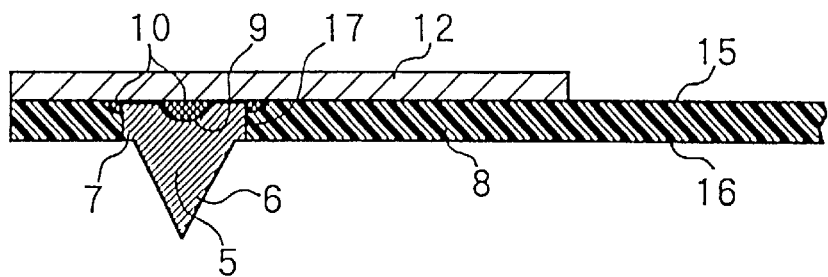

Subsequently, as shown in FIG. 1(F), the conductive foil 11 is subjected to etching treatment so that a plurality of leads 12 formed of a copper or copper alloy are formed. The leads 12 are then peeled off the bump forming plate 1. In the alternative, the conductive foil 11 can be peeled off without being subjected to etching treatment, and then the leads 12 may be formed by etching the foil 11. In order to facilitate easy peel-off, the insulative sheet 8 may be laminated on the surface of the bump forming plate 1 through a peeling material in FIGS. 1(B) and 1(C).

The contact structure manufactured through the processes of FIGS. 1(A) to 1(F) includes the lead 12 formed by etching the conductive foil 11 and the bump 5 formed by electric casting by means of plating. The bump 5 and the lead 12 are formed of different metals.

As one preferred example, the lead 12 is formed of a copper or copper alloy and the bump 5 is formed of a nickel or nickel alloy.

The bump 5 is connected to the surface of the lead 12 through the conductive connecting material (e.g. paste) 10. The lead 12 is intimately contacted at the surface, on which the bump 5 is disposed, with a first main surface 15 of a holeless insulative sheet 8.

A basal portion of the bump 5 is forcibly pierced into and extended all the way through the thickness of a material of the holeless insulative sheet 8 and a side surface of the basal portion of the bump 5 is fusion-adhered to an inner wall surface of the through-hole 17 and a bottom surface of the basal portion of the bump 5 is exposed from the surface of the insulative sheet 8. A distal end of the bump 5 is projected from a second main surface 16 of the insulative sheet 8 so as to form a press contact portion 6. This press contact portion 6 is subjected to press contact with an electrode pad of a given electric part.

A second embodiment of the present invention will now be described with reference to FIGS. 2(A)–2(F) and 3. A contact structure according to the second embodiment is manufactured in the following manners.

Figure 2A:
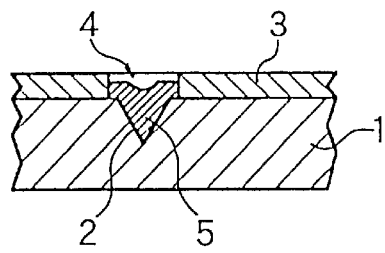
FIGS. 2(A) to 2(F) are sectional views showing the manufacturing processes of a contact structure according to a second embodiment of the present invention.
Figure 2B:
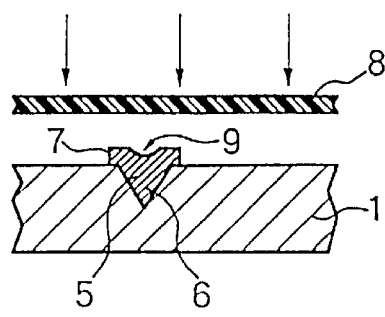
Figure 2C:
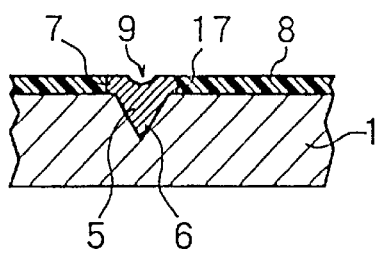
Figure 2D:
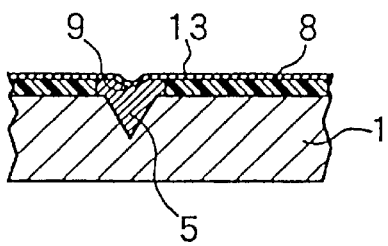
Figure 2E:
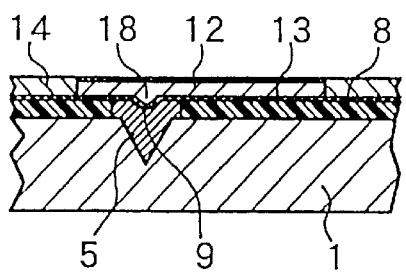

After the processes of FIGS. 2(A) to 2(C) are carried out as in FIGS. 1(A) to 1(C), a lead 12 formed of a copper or copper alloy is formed on a surface of an insulative sheet 8 of FIG. 2(C) by plating as shown in FIGS. 2(D) and 2(E).

More specifically, as shown in FIG. 2(D), an underground plating layer 13 is formed on the surface of the insulative sheet 8 of FIG. 2(C) in an intimately contacted and laminated state by vapor deposition, sputtering or chemical plating. Then, as shown in FIG. 2(E), a resist layer 14 having a lead pattern forming groove is formed on a surface of the underground plating layer 13, the underground plating layer 13 is exposed within the lead pattern forming groove, and the lead 12 is plate-grown on the underground plating layer 13 within the groove. That is to say, the lead 12 is formed by electric casting by means of plating. By this, the lead 12 is plate-connected to the bump 5.

Figure 2F:
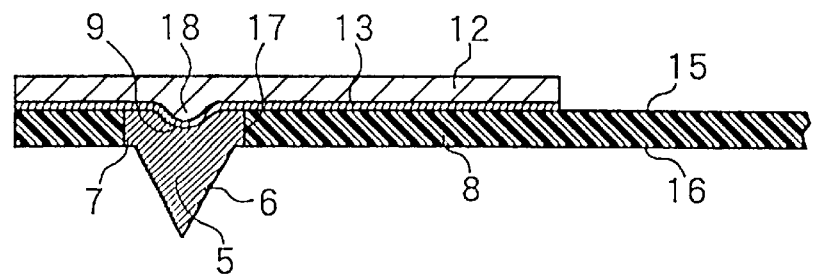

After the resist layer 14 is removed, an unnecessary part of the underground plating layer 13 is removed by etching. Then, the remaining underground plating layer 13 is peeled off the bump forming plate 1. By doing so, a contact structure of the lead 12 of FIG. 2(F) is obtained.

As shown in FIGS. 2(A), 2(B) and 2(C), the bump 5 formed of a nickel or nickel alloy which is formed by the plating growth is provided at a basal end face thereof, i.e., the plate-connecting surface with a dent 9, while the lead 12 includes a protrusion 18 plate-connected along an inner wall surface of the dent 9.

Accordingly, the bump 5 and the lead 12 are plate-connected with each other at an interface of a region including the protrusion 18 and at an interface of a region including the flange 7, respectively. By this, the connection area and connection strength are increased and electrical reliability is ensured.

As previously mentioned, a conical or spherical press contact portion 6 is formed on a distal end portion of the bump 5 of FIG. 3 within the bump forming recess 2, and a flange 7 is formed on a basal end portion of the bump 5 within the bump forming hole 4. The flange 7 is provided at a central area thereof, i.e., a central area of a bottom surface of the bump 5, with a dent 9.

The contact structure manufactured through the processes of FIGS. 2(A) to 2(F) includes the lead 12 formed by plating and the bump 5 formed by electric casting by means of plating. The bump 5 and the lead 12 are formed of different metals.

As one preferred example, the lead 12 is formed of a copper or copper alloy and the bump 5 is formed of a nickel or nickel alloy.

The bump 5 is plate-connected to the surface of the lead 12. The lead 12 is intimately contacted at the surface, on which the bump 5 is disposed, with a first main surface 15 of a holeless insulative sheet 8.

A basal portion of the bump 5 is forcibly pierced into and extended all the way through the thickness of a material of the holeless insulative sheet 8 and a side surface of the basal portion of the bump 5 is fusion-adhered to an inner wall surface of the through-hole 17 and a bottom surface of the basal portion of the bump 5 is exposed from the surface of the insulative sheet 8. A distal end of the bump 5 is projected from a second main surface 16 of the insulative sheet 8 so as to form a press contact portion 6. This press contact portion 6 is subjected to press contact with an electrode pad of a given electric part.

A third embodiment of the present invention will now be described with reference to FIGS. 4(A)–4(D) and 3. A contact structure according to the third embodiment is manufactured in the following manner.

Figure 4B:
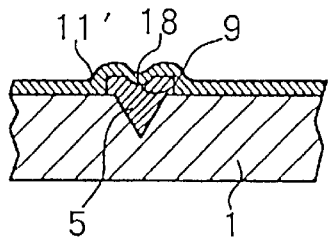
FIGS. 4(A) to 4(D) are sectional views showing the manufacturing processes of a contact structure according to a third embodiment of the present invention.
Figure 4A:
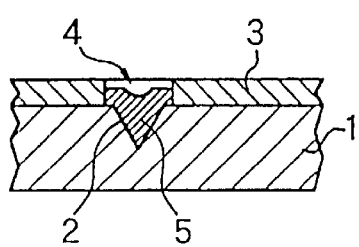

As shown in FIG. 4(A), a bump forming plate 1 formed of a stainless steel or the like has a plurality of bump forming recesses 2 which are open at a surface of the plate 1.

The overall area of the bump forming plate 1 only excluding the area where the bump forming recesses 2 are formed is covered with a resist layer 3. Bump forming holes 4 are formed in the resist layer 3 such that the holes 4 correspond to the recesses 2, individually.

Subsequently, plating growth is encouraged in each bump forming recess 2 and bump forming hole 4 so that the interior of each recess 2 and hole 4 is filled with a plating-grown metal as represented by a nickel or nickel alloy. That is to say, the bump 5 is formed in each recess 2 and hole 4 by electric casting.

As shown in FIG. 3, a conical or spherical press contact portion 6 is formed on a distal end portion of this bump 5 within the bump forming recess 2, and a flange 7 is formed on a basal portion of the bump 5 within the bump forming hole 4. The flange 7 is provided at a central area thereof, i.e., a central area of a bottom surface of the bump 5, with a dent 9.

As shown in FIG. 4(B), after the resist layer 3 is removed, a conductive plating layer 11' formed of a copper or copper alloy is laminated on the surface of the bump forming plate 1 by plating.

The conductive plating layer 11' includes a protrusion 18 plate-connected along an inner wall surface of the dent 9.

Figure 4C:
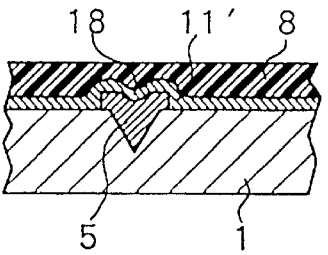

Then, as shown in FIG. 4(C), an insulative sheet 8 is laminated on the surface of the conductive plating layer 11' by thermal press adhesion.

Figure 4D:
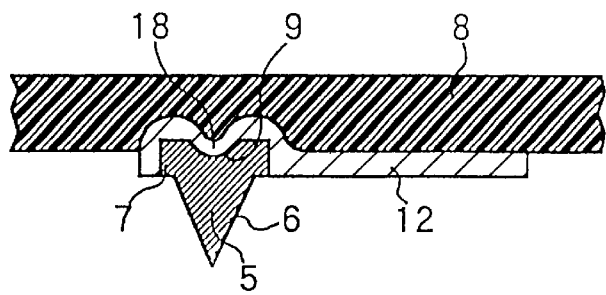

Then, as shown in FIG. 4(D), the laminated member formed in FIG. 4(C) is peeled off the bump forming plate 1 and the conductive plating layer 11' is subjected to etching treatment. By doing so, a plurality of leads 12 formed of a copper or copper alloy are formed.

The contact structure manufactured through the processes of FIGS. 4(A) to 4(D) includes the lead 12 formed by plating and the bump 5 formed by electric casting by means of plating. The bump 5 and the lead 12 are formed of different metals.

As one preferred example, the lead 12 is formed of a copper or copper alloy and the bump 5 is formed of a nickel or nickel alloy.

The lead 12 is intimately contacted with and extended along the surface of the insulative sheet 8, and the bump 5 is plate-connected to the surface of the lead 12.

The bump 5 has a dent 9 formed in the plate-connecting surface, and the lead 12 has a protrusion 18 plate-connected along an inner wall surface of the dent 9.

Accordingly, the bump 5 and the lead 12 are plate-connected with each other at an interface of a region including the protrusion 18 and at an interface of a region including the flange 7, respectively. By this, the connection area and connection strength are increased and electrical reliability is ensured.

A part of the lead 12 connected, by plating, to the bump 5 is embedded in the insulative sheet 8.

A fourth embodiment of the present invention will now be described with reference to FIGS. 5(A)–5(E) and 3. A contact structure according to the fourth embodiment is manufactured in the following manners.

Figure 5A:
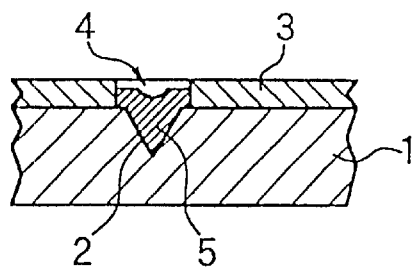
FIGS. 5(A) to 5(E) are sectional views showing the manufacturing processes of a contact structure according to a fourth embodiment of the present invention.

As shown in FIG. 5(A), a bump forming plate 1 formed of a stainless steel or the like has a plurality of bump forming recesses 2 which are open at a surface of the plate 1.

The overall area of the bump forming plate 1 only excluding the area where the bump forming recesses 2 are formed is covered with a resist layer 3. Bump forming holes 4 are formed in the resist layer 3 such that the holes 4 correspond to the recesses 2, individually.

Subsequently, plating growth is encouraged in each bump forming recess 2 and bump forming hole 4 so that the interior of each recess 2 and hole 4 is filled with a plating-grown metal as represented by a nickel or nickel alloy. That is to say, the bump 5 is formed in each recess 2 and hole 4 by electric casting.

As shown in FIG. 3, a conical or spherical press contact portion 6 is formed on a distal end portion of this bump 5 within the bump forming recess 2, and a flange 7 is formed on a basal portion of the bump 5 within the bump forming hole 4. The flange 7 is provided at a central area thereof, i.e., a central area of a bottom surface of the bump 5, with a dent 9.

Figure 5B:
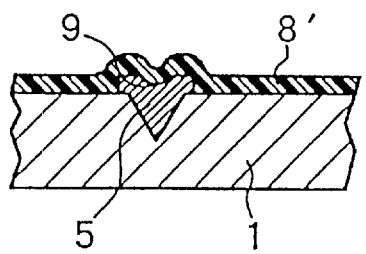

As shown in FIG. 5(B), after the resist layer 3 is removed, a photo sensitive resin layer 8' as represented by photo sensitive polyimide is laminated on the surface of the bump forming plate 1.

Figure 5C:
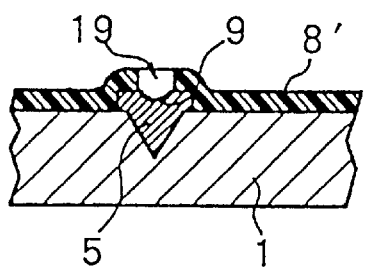

As shown in FIG. 5(C), the photo sensitive layer 8' is subjected to exposure and a plating-grown hole 19 communicating with the dent 9 is formed in a part of the layer 8' corresponding to the basal end face of the bump 5.

It is also accepted that instead of the photo sensitive resin layer 8', an insulative sheet having no photo sensitive property such as polyimide can be laminated on the surface of the bump forming plate 1 and the plating grown hole 19 communicating with the dent 9 can be formed in a part of the insulative sheet corresponding to the basal end face of the bump 5 by laser beam.

Figure 5D:
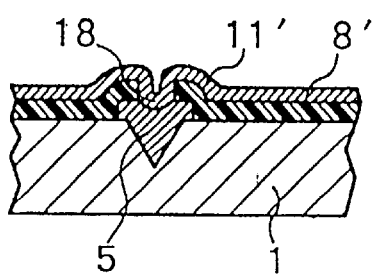

Then, as shown in FIG. 5(D), the surface of the photo sensitive resin layer 8' or insulative sheet 8 is subjected to plating treatment so that a conductive plating layer 11' as represented by a copper or copper alloy is laminated thereon.

Figure 5E:
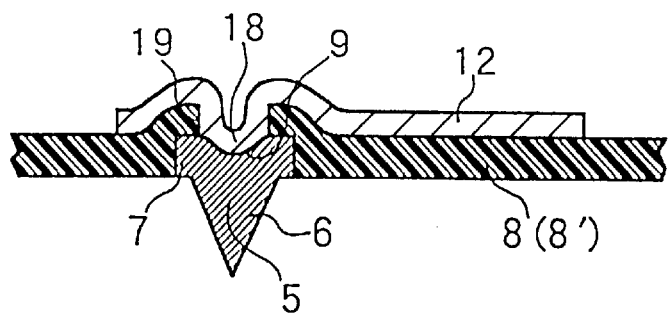

Subsequently, as shown in FIG. 5(E), the conductive layer 11' is subjected to etching treatment so that the lead 12 formed of a copper or copper alloy is formed. Then, the laminated member is peeled off the bump forming plate 1.

As one method for forming the lead 12, the lead 12 may be formed directly by plating or through an additive method. Since this method is known, detailed description thereof is omitted.

The contact structure manufactured through the processes of FIGS. 5(A) to 5(E) includes the lead 12 formed by plating and the bump 5 formed by electric casting by means of plating. The bump 5 and the lead 12 are formed of different metals.

As one preferred example, the lead 12 is formed of a copper or copper alloy and the bump 5 is formed of a nickel or nickel alloy.

The lead 12 is intimately contacted with and extended along the surface of the insulative sheet 8, and the bump 5 is plate-connected to the surface of the lead 12.

As shown in FIG. 3, a conical or spherical press contact portion 6 is formed on a distal end portion of this bump 5 within the bump forming recess 2, and a flange 7 is formed on a basal portion of the bump 5 within the bump forming hole 4. The flange 7 is provided at a central area thereof, i.e., a central area of a bottom surface of the bump 5, with a dent 9.

That is to say, the bump 5 has a dent 9 formed in the plate-connecting surface, and the lead 12 has a protrusion 18 plate-connected along an inner wall surface of the dent 9.

Accordingly, the bump 5 and the lead 12 are plate-connected with each other at an interface of a region including the protrusion 18 and at an interface of a region including the flange 7, respectively. By this, the connection area and connection strength are increased and electrical reliability is ensured.

The protrusion 18 plate-connected to the bump 5 is embedded in the insulative sheet 8 formed of the photo sensitive resin layer 8'.

According to the present invention, there can be provided a contact structure of a lead in which a contact structure having a lead and a bump formed of proper metals, respectively can easily be formed and a bump and a lead are soundly connected together in terms of electricity and strength.

Obviously, many modifications and variations of the present invention are possible in light of the above teachings. It is, therefore, to be understood that within the scope of the appended claims, the invention may be practiced otherwise than as specifically described.

What is claimed is:

1. A contact structure of a lead comprising:

a lead formed by etching a conductive foil;

a bump formed by electric casting by means of plating;

said bump and said lead being formed of different metals, respectively;

said bump being connected to a surface of said lead through a conductive connecting material;

said lead being intimately contacted at a surface, on which said bump is disposed, with a first main surface of a holeless insulative sheet;

a basal portion of said bump being forcibly pierced into and extended all the way through the thickness of a material of said holeless insulative sheet and a side surface of the basal portion of said bump being fusion-adhered to an inner wall surface of said through-hole; and a distal portion of said bump being projected from a second main surface of said insulative sheet.

2. A contact structure of a lead comprising:

a lead formed by plating;

a bump formed by electric casting by means of plating;

said bump and said lead being formed of different metals, respectively;

said bump being connected, by plating, to a surface of said lead;

said lead being intimately contacted at a surface, on which said bump is disposed, with a first main surface of a holeless insulative sheet;

a basal portion of said bump being forcibly pierced into and extended all the way through the thickness of a material of said holeless insulative sheet and a side surface of the basal portion of said bump being fusion-adhered to an inner wall surface of said through-hole; and a distal portion of said bump being projected from a second main surface of said insulative sheet.

3. A contact structure of a lead comprising:

a lead formed by plating:

a bump formed by electric casting by means of plating;

said bump and said lead being formed of different metals, respectively;

said bump being connected, by plating, to a surface of said lead;

said bump having a recess formed in the plate-connecting surface and said lead having a protrusion portion connected, by plating, along an inner wall surface of said recess; and said lead being intimately contacted with a surface of an insulative sheet.

4. A contact structure of a lead according to claim 3, wherein a part of said lead connected, by plating, to said bump is embedded in said insulative sheet.

* * * * *